US012364939B2

(12) United States Patent
Baetzold et al.

(10) Patent No.: US 12,364,939 B2
(45) Date of Patent: Jul. 22, 2025

(54) FILTRATION DESIGN FOR IMMERSION COOLING TANK SYSTEMS

(71) Applicant: 3M INNOVATIVE PROPERTIES COMPANY, St. Paul, MN (US)

(72) Inventors: John P. Baetzold, North St. Paul, MN (US); Phillip E. Tuma, Faribault, MN (US); Margaret M. Vogel-Martin, Forest Lake, MN (US); Bamidele O. Fayemi, Cottage Grove, MN (US); Ronald D. Jesme, Plymouth, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 471 days.

(21) Appl. No.: 17/639,971

(22) PCT Filed: Sep. 10, 2020

(86) PCT No.: PCT/IB2020/058421
§ 371 (c)(1),
(2) Date: Mar. 3, 2022

(87) PCT Pub. No.: WO2021/048785
PCT Pub. Date: Mar. 18, 2021

(65) Prior Publication Data
US 2022/0314147 A1    Oct. 6, 2022

Related U.S. Application Data (60) Provisional application No. 62/898,585, filed on Sep. 11, 2019.

(51) Int. Cl.
*B01D 35/027*    (2006.01)
*B01D 35/143*    (2006.01)
(Continued)

(52) U.S. Cl.
CPC ....... *B01D 35/0276* (2013.01); *B01D 35/143* (2013.01); *B01D 35/18* (2013.01);
(Continued)

(58) Field of Classification Search
CPC . B01D 35/143; B01D 35/26; B01D 2201/301
See application file for complete search history.

(56) References Cited

U.S. PATENT DOCUMENTS

| 4,756,826 A | 7/1988 | Horvath |
| 4,869,225 A | 9/1989 | Nagata |

(Continued)

FOREIGN PATENT DOCUMENTS

| CN | 207519036 | 6/2018 | |
| DE | 102008044299 A1 * | 6/2010 | ............. G01N 21/80 |

(Continued)

OTHER PUBLICATIONS

Genssle et al—DE 102008044299 A1 FIT translation—Jun. 10, 2010 (Year: 2010).*

(Continued)

*Primary Examiner* — Bradley R Spies
(74) *Attorney, Agent, or Firm* — Jonathan L. Tolstedt (57) ABSTRACT

A filtration system for a tank includes a filter housing, at least a portion of which is disposed in a tank and in fluidic communication with a dielectric fluid within the tank; at least one filtration element, disposed within the filter housing; and a fluid pump, at least a portion of which is disposed within the filter housing and immersed in the dielectric fluid, the fluid pump in fluidic communication with the at least one filtration element.

7 Claims, 5 Drawing Sheets

(51) Int. Cl.
  *B01D 35/18* (2006.01)
  *B01D 35/26* (2006.01)
  *H05K 7/20* (2006.01)

(52) U.S. Cl.
  CPC ......... *B01D 35/26* (2013.01); *H05K 7/20236* (2013.01); *B01D 2201/287* (2013.01); *B01D 2201/301* (2013.01)

(56) References Cited

U.S. PATENT DOCUMENTS

| | | | |
|---|---|---|---|
| 5,392,750 | A | 2/1995 | Laue |
| 5,688,398 | A | 11/1997 | Jacquelin |
| 5,766,464 | A | 6/1998 | Campbell |
| 6,719,539 | B1 | 4/2004 | Yoshioka |
| 10,206,307 | B2 | 2/2019 | Lau |
| 2002/0033168 | A1 | 3/2002 | Noda |
| 2003/0183564 | A1 | 10/2003 | Nguyen |
| 2013/0276629 | A1 | 10/2013 | Salahshour et al. |
| 2014/0307384 | A1 | 10/2014 | Best |
| 2017/0064862 | A1 | 3/2017 | Miyoshi |
| 2017/0326489 | A1 | 11/2017 | Lau |
| 2018/0266311 | A1 * | 9/2018 | Hoover ............. F02D 19/029 |
| 2018/0279507 | A1 | 9/2018 | Midgley |

FOREIGN PATENT DOCUMENTS

| | | | |
|---|---|---|---|
| JP | 2004323785 A | * | 11/2004 |
| WO | WO 2017-199092 | | 11/2017 |

OTHER PUBLICATIONS

Ota et al—JP 2004-323785 A FIT translation—Nov. 18, 2004 (Year: 2004).*
"Datasheet-BH1745NUC", Digital 16bit Serial Output Type Color Sensor IC, Jun. 2014, Rohm Semiconductor, Revision 001, 22 pages.
"SD-214/062012", Replaceable Core Catch-All Filter-Drier: Installation and Servicing Instructions, 2012, Parker Hannifin Corporation, 4 pages.
3M™ High Flow Filter System, "High Performance Media in an Innovative Design", 2018, 16 pages.
3M™ Two-Phase Immersion Cooling, "High Level Best Practices for System Fabrication", 2014, Technical Paper, pp. 1-4.
Sporlan, "Catch-All®—Liquid & Suction Line Filter-Driers", Jun. 2015, Parker, Bulletin 40-10, pp. 1-48.
Tuma, "Design Considerations Relating to Non-Thermal Aspects of Passive 2-Phase Immersion Cooling", 2011, 27th Annual IEEE Semiconductor Thermal Measurement and Management Symposium, pp. 1-9.
Tuma, "Fluoroketone C2F5C(O)CF(CF3)2 as a Heat Transfer Fluid for Passive and Pumped 2-Phase Applications," 2008, 24th Annual IEEE Semiconductor Thermal Measurement and Management Symposium, pp. 173-179.
Tuma, "The Merits of Open Bath Immersion Cooling of Datacom Equipment", 2010, 26th Annual IEEE Semiconductor Thermal Measurement and Management Symposium (SEMI-THERM), 9 pages.
International Search Report for PCT Application No. PCT/IB2020/058421, mailed on Oct. 27, 2020, 5 pages.

* cited by examiner

FILTRATION DESIGN FOR IMMERSION COOLING TANK SYSTEMS

CROSS REFERENCE TO RELATED APPLICATIONS

This application is a national stage filing under 35 U.S.C. 371 of PCT/IB2020/058421 filed Sep. 10, 2020, which claims the benefit of Provisional Application No. 62/898,585, filed Sep. 11, 2019, the disclosure of which is incorporated by reference in its/their entirety herein.

SUMMARY

In some aspects of the present description, a filtration system for a tank is provided, including a filter housing, at least a portion of which is disposed in a tank and in fluidic communication with a dielectric fluid within the tank; at least one filtration element, disposed within the filter housing; and a fluid pump, at least a portion of which is disposed within the filter housing and immersed in the dielectric fluid, such that the fluid pump is in fluidic communication with the at least one filtration element.

In some aspects of the present description, a method of filtering a fluid within a tank in provided, including the steps of disposing at least one filtration element within a filter housing, the filter housing including a fluid inlet and a fluid outlet; disposing a fluid pump within the filter housing, such that it is in fluidic communication with the at least one filtration element, the fluid inlet, and the fluid outlet; immersing at least a portion of the filter housing in a dielectric fluid contained within a tank, such that the fluid inlet is in fluidic communication with the dielectric fluid; and operating the fluid pump, such that the dielectric fluid passes from the fluid inlet through at least a portion of the at least one filtration element to the fluid outlet.

In some aspects of the present invention, an immersion cooling system is provided, including a tank, at least a portion of which is filled with a dielectric fluid; a filter housing, at least a portion of which is disposed in the tank and in fluidic communication with the dielectric fluid, the filter housing including an opening on a surface of the filter housing accessible from outside the tank; at least one filtration element, disposed within the filter housing; and a fluid pump, at least a portion of which is disposed within the filter housing and immersed in the dielectric fluid, the fluid pump in fluidic communication with the at least one filtration element.

DETAILED DESCRIPTION

In the following description, reference is made to the accompanying drawings that form a part hereof and in which various embodiments are shown by way of illustration. The drawings are not necessarily to scale. It is to be understood that other embodiments are contemplated and may be made without departing from the scope or spirit of the present description. The following detailed description, therefore, is not to be taken in a limiting sense.

Filtration is an important part of the operation of immersion cooling tank systems, such as those used to remove excess heat from data center electronic servers. Often, the materials used in the system hardware were not originally designed to be continuously immersed in liquid (e.g., a dielectric coolant fluid). Materials from the immersed electronic components (e.g., adhesives, thermal interface materials, sealants, solder paste, dielectric grease, etc.) can break free or be extracted and be redeposited onto sensitive electronic components, potentially causing thermal management issues or corrosion problems. Many immersion cooling systems employ filtration systems to clean the fluid of the contaminants to avoid costly downtime and system failures.

Many existing immersion tank designs provide filtration units which are attached outside the tank. These external filtration systems present several challenges, including external fluid conduits and pump seals which are subject to leaking. In addition, access to the filters and pump hardware may be limited, making system maintenance and the associated downtime prohibitively expensive.

According to some aspects of the present description, a filtration system for a tank (e.g., an immersion cooling system tank) is provided to address these issues, including a filter housing, at least one filtration element, and a fluid pump. In some embodiments, the at least one filtration element and the fluid pump are disposed within the filter housing. In some embodiments, at least a portion of the filter housing is disposed in a tank such that the filter housing, the at least one filtration element, and the fluid pump are in fluidic communication with a dielectric fluid within the tank.

In some embodiments, the filtration element may be any appropriate filter media, or combination of filter media, which may include, but is not limited to, active carbon, molecular sieves, silica gel, or alumina. In some embodiments, the filtration element may be any appropriate commercially-available filter "core", for example, any of a number of filter cores manufactured by the Sporlan Division of the Parker Hannifin Corporation, or the filter cartridges manufactured by 3M Purification Inc. In some embodiments, changes to the molds and/or forming processes of existing commercially-available filtration elements may be made to adapt them for a specific housing or application. In some embodiments, a color-changing material (e.g., the organic compound phenolphthalein, or cobalt chloride) may be added to the filtration element to provide an indication of the condition (e.g., remaining life) of the filter media. In some embodiments, one or more sensors may be added on or in proximity to the filtration element, such that a status of the filter media may be provided to an external system of user. In some embodiments, the sensor may be an electronic sensor which monitors changes in an electrical property of the filter element as the filter element absorbs certain types of contaminants. In some embodiments, the sensor may be a sensor which detects a change in a color-changing material.

In some embodiments, the fluid pump may be unsealed (i.e., not environmentally sealed against moisture or liquid).

In some embodiments, one or more electrical connections from the unsealed pump may be exposed and at least partially immersed in the dielectric fluid. The dielectric fluid may be any appropriate dielectric fluid, such as a dielectric coolant fluid (e.g., Novec™ Engineered Fluid manufactured by 3M™, or Galden® perfluoropolyether fluorinated fluids manufactured by Solvay.)

In some embodiments, the filter housing may include an opening (e.g., an open end or access portal) disposed on a portion of the housing that extends outside the tank (i.e., is open and accessible to systems or personnel external to the tank.) In some embodiments, the filtration system may further include an elongated member (e.g., a central rod or connecting fixture) which connects the filtration elements together. In some embodiments, the elongated member may also connect the fluid pump to the filtration elements. In some embodiments, the filtration elements and/or the fluid pump may be removable through the opening in the housing using the elongated member (e.g., pulling the elongated member lifts the filtration elements and/or pump so that it can be accessed, evaluated, or removed/replaced).

According to some aspects of the present description, a method of filtering a fluid within a tank includes the steps of disposing at least one filtration element (e.g., a filter media) within a filter housing, the filter housing including a fluid inlet and a fluid outlet; disposing a fluid pump within the filter housing, such that it is in fluidic communication with the at least one filtration element, the fluid inlet, and the fluid outlet; immersing at least a portion of the filter housing in a dielectric fluid contained within a tank, such that the fluid inlet is in fluidic communication with the dielectric fluid; and operating the fluid pump, such that the dielectric fluid passes from the fluid inlet through at least a portion of the at least one filtration element to the fluid outlet. In some embodiments, the fluid inlet and the fluid outlet of the filter housing may be the same (i.e., fluid may enter and leave the housing through the same opening/passage within the housing.)

In some embodiments, the method may include including an opening (e.g., an access point) within the filter housing such that the filtration element(s) and/or the fluid pump may be removed, observed, or otherwise access from outside the tank (i.e., the portion of the filter housing hosting the opening is accessible from a point external to the tank.) In some embodiments, the opening may be covered/protected by a cover (e.g., a sanitary lid).

In some embodiments, the method may include providing a sensor for determining a status (e.g., the remaining life/capacity) of the filtration element(s). In some embodiments, the sensor may be a color-changing sensor (e.g., a material which changes color through continued exposure to certain conditions, such as reactions with decomposition products within the filter). In some embodiments, the sensor may be an electronic sensor (i.e., a sensor which measures one or more electrical properties of a filter based on the presence or absence of certain compounds or impurities). In some embodiments, the status indicated by the sensor (i.e., the condition of the filter media) may be attainable from outside the filter housing without removing the filtration elements or fluid pump.

In some embodiments, one or more electrical connections of the fluid pump may be unsealed (i.e., not environmentally sealed against exposure to fluid or other factors), and may be at least partially immersed within the dielectric fluid within the tank. In some embodiments, the electrical connections for the fluid pump may be simple pin connections, which can be easily connected/disconnected for maintenance or replacement of the pump.

In some embodiments, the method of filtering a fluid within a tank may further include the step of connecting two or more filtration elements together, or at least one filtration element and the fluid pump, such that the filtration elements and/or the fluid pump may be removed through an opening in the filter housing using the elongated member. In some embodiments, the elongated member may also be used to insert/install the filtration elements and/or the fluid pump within the housing (including connecting the electrical connections of the fluid pump with mating electrical connections within or accessible through the filter housing.)

According to some aspects of the present description, an immersion cooling system includes a tank, at least partially filled with dielectric fluid; a filter housing at least partially disposed in the tank and in fluidic communication with the dielectric fluid; at least one filtration element, disposed within the filter housing; and a fluid pump, at least partially disposed within the filter housing and immersed in the dielectric fluid, the fluid pump in fluidic communication with the at least one filtration element. In some embodiments, the filter housing includes an opening on a surface of the filter housing accessible from outside the tank. In some embodiments, an elongated member (e.g., a connecting central core or bracket) connects two or more filtration elements, or at least one filtration element and the fluid pump, and may be used to remove the filtration elements and/or the fluid pump through the opening. In some embodiments, the opening may include a removable cover (e.g., a sanitary lid).

Figure 1:
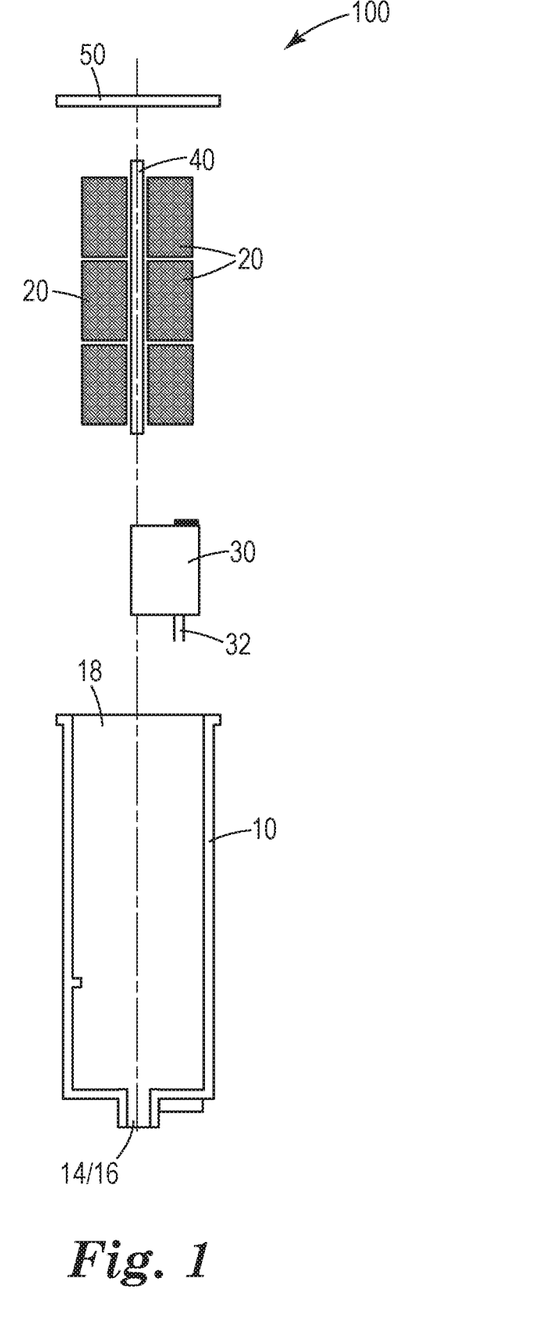
FIG. 1 is an exploded view of a filter housing assembly, in accordance with an embodiment of the present description.

Turning now to the figures, FIG. 1 provides an exploded, cut-away view of a filter housing assembly 100, according to an embodiment of the present description. In some embodiments, the filter housing assembly 100 may include a filter housing 10. Filter housing 10 may be constructed of any appropriate material, and in particular any material which will not interact with fluorinated fluids (e.g., dielectric coolant fluid) or contaminants found in the fluid. In some embodiments, these materials may include, but not be limited to, polypropylene, high-density polyethylene, and stainless steel. In some embodiments, filter housing 10 may be generally shaped as a cylinder or rectangular prism, or any other appropriate shape defining a substantially enclosed inner volume for holding system components (e.g., filter media, fluid pump, etc.) In some embodiments, filter housing 10 has a cover 50, which may be a lid and/or a sanitary fitting, which may be constructed of a material similar to the housing, or may be a separate material. In some embodiments, filter housing 10 may have a fluid inlet 14 and a fluid inlet 16. In some embodiments, fluid inlet 14 and fluid outlet 16 may be substantially co-located (e.g., different portions of a shared opening in filter housing 10.) In some embodiments, fluid inlet 14 and fluid outlet 16 may be located on different portions of filter housing 10. In some embodiments, filter housing 10 includes an opening 18 for accessing components contained within filter housing 10.

In some embodiments, filter housing assembly 100 may include one or more filtration elements 20. Filtration elements 20 may be any appropriate type of filter media (i.e., a material through which fluid passes such that some impurities or particles may be removed from the fluid). Filter housing assembly 100 may include any appropriate number of filtration elements 20, including but not limited to 1, 2, 4, 6, 8, 10, or 20. In some embodiments, all filtration elements 20 may contain the same filter media. In some embodiments, one or more subsets of filtration elements 20 may contain different filter media. For example, a first subset of filtration elements 20 may contain activated carbon to remove hydrocarbon contaminants, a second subset of filtration elements 20 may include activated alumina, and a third subset of filtration elements 20 may include indicating alumina (i.e., activated alumina combined with a color-changing material such as phenolphthalein). Any appropriate number and combination of filter media may be used within the intent of the disclosure.

In some embodiments, filter housing assembly 100 may include a fluid pump 30. In some embodiments, fluid pump 30 include electrical contacts 32. In some embodiments, electrical contacts 32 may be unsealed (i.e., not environmentally sealed against moisture/water). In some embodiments, electrical contacts 32 may be conducting pins or pads which can be easily connected to mating electrical contacts in the filter housing 10 or accessible external to filter housing 10 (i.e., by passing through an opening in filter housing 10 to mate with a connector outside the filter housing 10).

In some embodiments, filtration elements 20 and fluid pump 30 may be attached to and connected by an elongated member 40. In some embodiments, elongated member 40 may be a central core (e.g., a metal shaft extending past or through the components). In some embodiments, elongated member 40 may be mounting fixture or container (e.g., a "sleeve" or cage enclosing filtration elements 20 and/or fluid pump 30). In some embodiments, elongated member 40 may connect two or more filtration elements 20 to each other. In some embodiments, elongated member 40 may connect one or more filtration elements 20 and fluid pump 30. In some embodiments, the filtration elements 20 and/or fluid pump 30 may be removed from opening 18 using elongated member 40 (i.e., removing elongated member 40 through opening 18 also removes filtration elements 20 and/or fluid pump 40). In some embodiments, elongated member 40 may also be used to insert/install filtration components 20 and/or fluid pump 30 into the filter housing 10.

Figure 2:
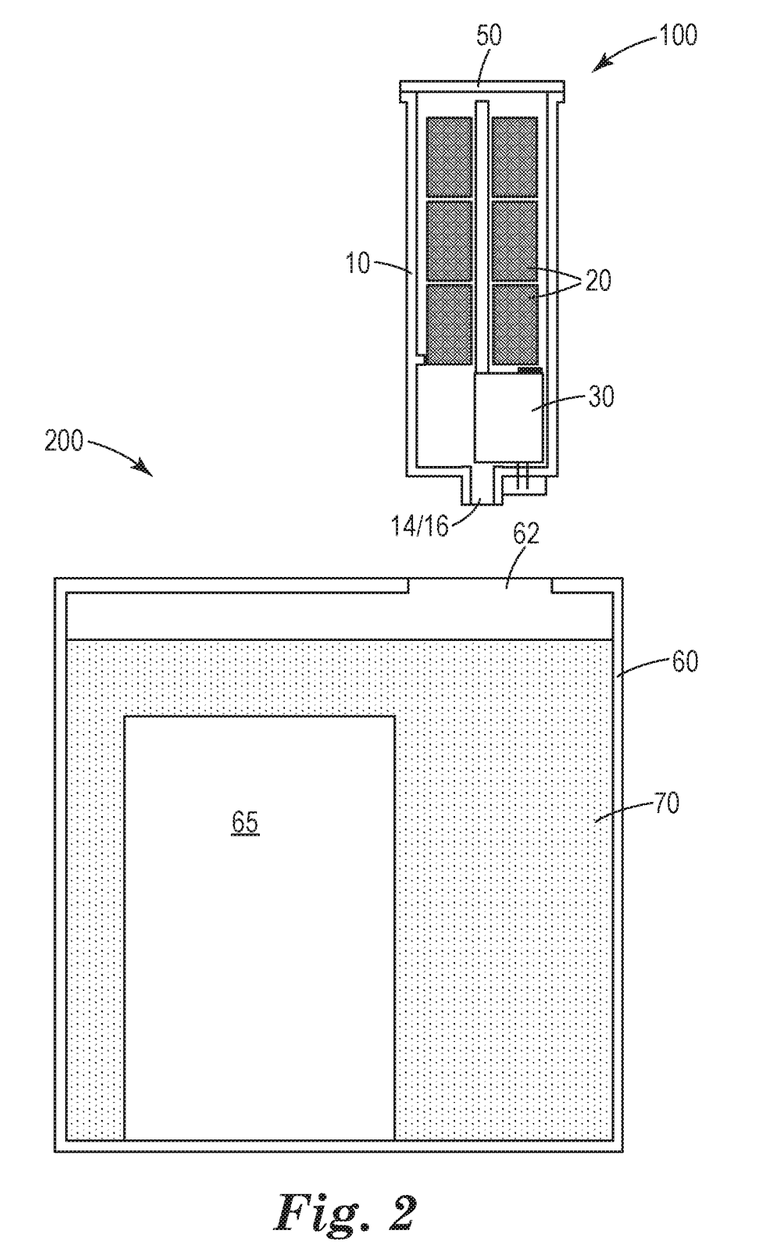
FIG. 2 is an exploded view of an immersion cooling system, in accordance with an embodiment of the present description.
Figure 3:
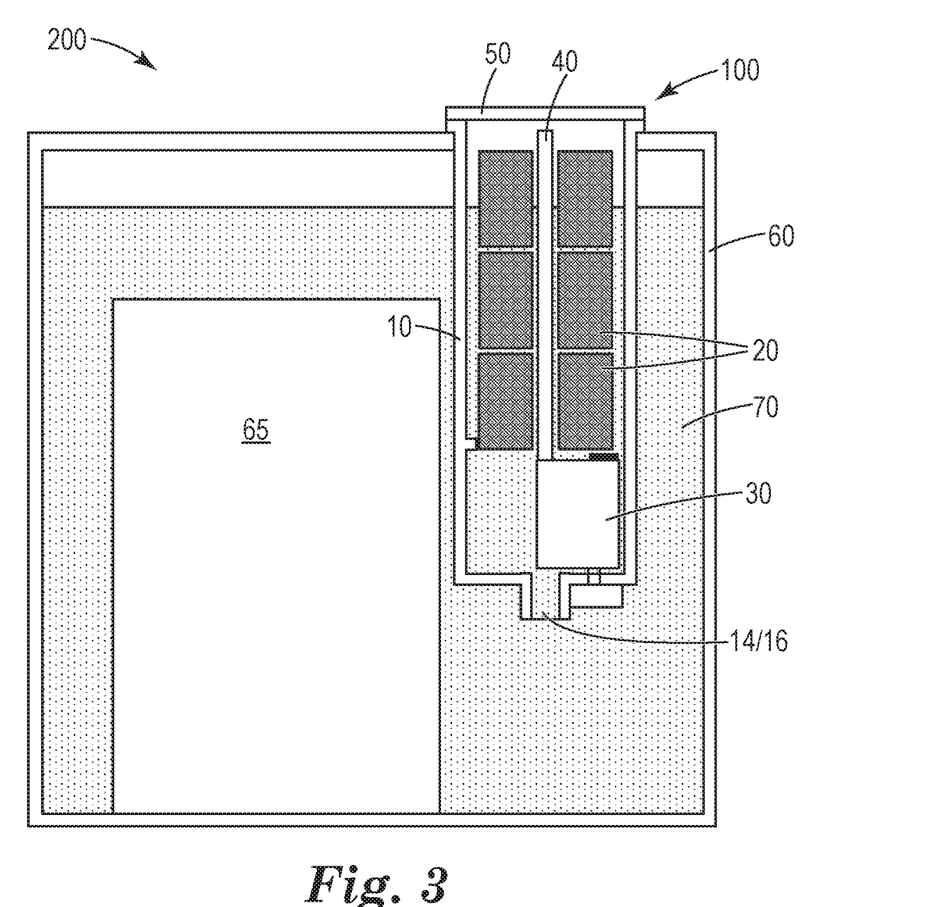
FIG. 3 is an assembled, cut-away view of an immersion cooling system, in accordance with an embodiment of the present description.

FIG. 2 is an exploded, cut-away view of an immersion cooling system, according to an embodiment of the present description, and FIG. 3 provides an assembled, cut-away view of the immersion cooling system. FIGS. 2 and 3 may be examined together for the following discussion. In some embodiments, immersion cooling system 200 includes a liquid tank 60 and a filter housing assembly 100 (such as filter housing assembly 100 of FIG. 1). In some embodiments, assembled filter housing assembly 100 includes filter housing 10 containing (or at least partially containing, in some embodiments) filtration elements 20 and fluid pump 30. In some embodiments, filtration elements 20 and fluid pump 30 are connected by an elongated member 40 (see FIG. 1). In some embodiments, fluid housing 10 includes a cover 50.

In some embodiments, tank 60 may be at least partially filled with a dielectric fluid 70 (e.g., a dielectric coolant). In some embodiments, an electronics module 65 may be at least partially immersed in dielectric fluid 70. In some embodiments, electronics module 65 may be a computer server, a power supply, one or more memory modules, or any other appropriate electronic module or combination thereof.

In some embodiments, filter housing assembly 100 may be inserted into an opening or open end 62 of tank 60, such that the filter housing 10 is at least partially immersed in dielectric fluid 70 (see FIG. 3). In some embodiments, dielectric fluid 70 is allowed to pass into filter housing 10 through fluid inlet 14, where it is taken in by fluid pump 30 and circulated through the interior of filter housing 10. During its circulation through filter housing 10, dielectric fluid 70 passes through one or more of filtration elements 20, which remove impurities from the fluid. After passing through the filter housing 10 and filtration elements 20, the filtered dielectric fluid 70 may exit filter housing 10 through fluid outlet 16, passing back into the interior of tank 60.

It should be noted that, in some embodiments, a portion of filter housing 10 may extend above or be flush with an external surface of tank 60, such that opening 18 (see FIG. 1) of filter housing 10 is accessible outside the tank 60. In some embodiments, personnel (not shown) may remove cover 50 to inspect and/or remove filtration elements 20 and/or fluid pump 30 from filter housing 10. In some embodiments, filtration elements 20 and fluid pump 30 are connected by elongated member 40, and may be removed from filter housing 10 by pulling up on elongated member 40. Electrical connections 32 (see FIG. 1) on fluid pump 30 may be designed to easily connect and disconnect from mating connectors within the filter housing 10 or tank 60 when removed from the filter housing 10 (e.g., electrical connectors 32 may be conducting pin conductors which are pushed into mating receptacles in the filter housing 10 when the pump is lowered into the filter housing 10). The quick-connect nature of electrical connections 32 is enabled at least in part by the use of dielectric fluid 70, which is a non-conducting medium which can be used for cooling electronic components.

Figure 4A:
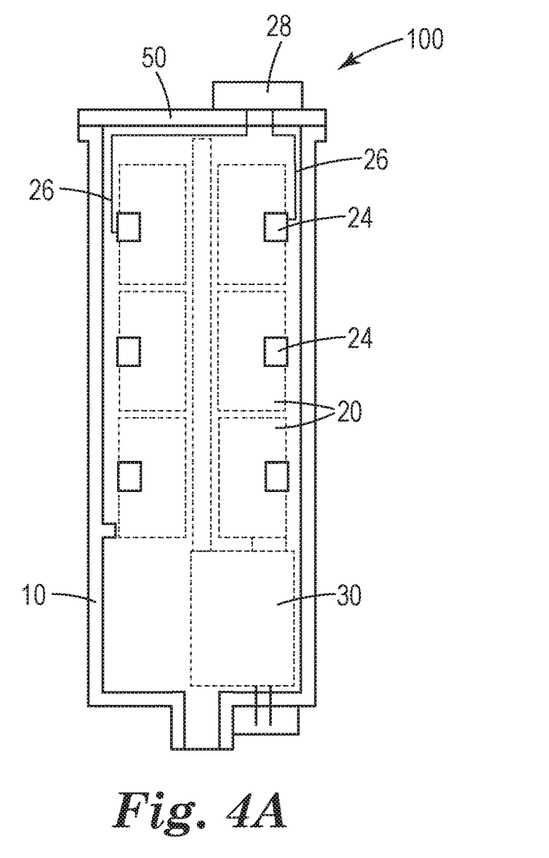
FIGS. 4A and 4B are cut-away views illustrating embodiments of a sensing system for a filtration system, in accordance with an embodiment of the present description.
Figure 4B:
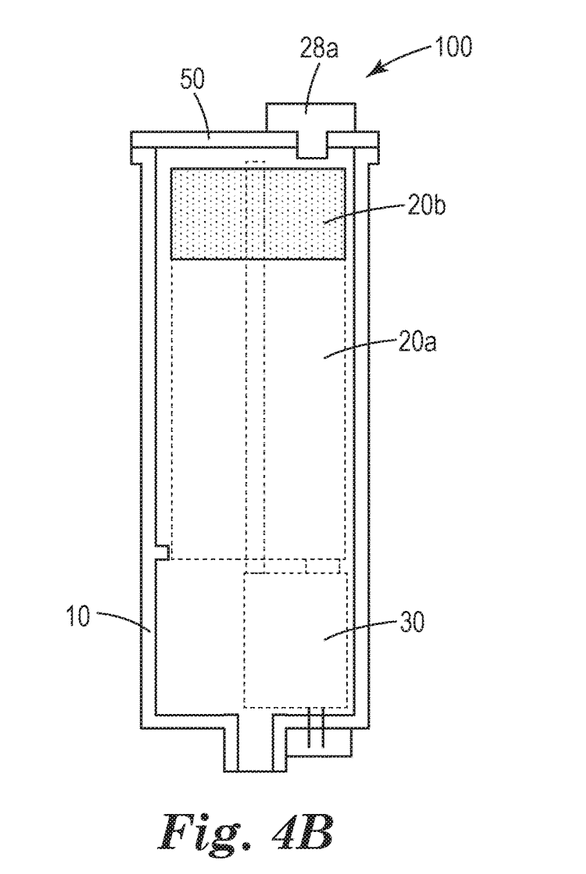

In some embodiments, the filtration systems described herein may include one or more sensors which can detect and indicate the status of the filter media used (e.g., indicate when replacement of filters is recommended.) FIGS. 4A and 4B provide cut-away views illustrating two alternate embodiments of a sensing system for a filtration system. In the figures, filtration elements 20 and fluid pump 30 are shown as dashed lines to provide focus on the sensing system.

In the embodiment of FIG. 4A, a sensing system may include a central electronic module 28 and one or more satellite sensors 24. In some embodiments, the satellite sensors 24 may be connected to central module 28 via one or more electrical connections 26 (for simplicity, only electrical connections 26 are only shown for two of the satellite sensors 24, but would be present for each satellite sensor 24 in practice.) In some embodiments, satellite sensors 24 may be sensors which detect a condition or property of a corresponding filtration element 20. For example, in some embodiments, satellite sensors 24 may be electronic sensors which monitor one or more electrical properties of a filtration element 20 (e.g., the filtration element's ability to carry an electrical current, which may be an indication of the materials contained within the filtration element). Central module 28 may receive signals from or poll individual satellite sensors 24 to determine the status of the filtration elements 20 and provide that status to an external system or observer (e.g., display an indication that replacement is needed, or transmit a message to control system.)

An alternate type of sensing system is shown in FIG. 4B. In the embodiment of FIG. 4B, filtration elements 20 (shown as 20a/20b) may be designed such that at least a portion of the filtration elements 20b contains a color-changing material (e.g., a material which changes color upon reaction with decomposition products within the filtration elements). In such a system, a color-changing sensor 28a may be placed on a transparent cover 50 or in an opening through cover 50 such that it can optically sense a change in material cover in filtration element 20b. In some embodiments, filtration elements 20 may additionally include a section 20a which contains filter media but which does not include the color-changing material. One advantage of the embodiment of FIG. 4B is that it requires no wired connections between the sensing module 28a and filtration element 20b, and thus may require less maintenance.

It should be noted that the sensing systems illustrated in FIGS. 4A and 4B are examples only and not intended to be limiting in any way. Other methods of sensing and sensor types, as well as other arrangements and configurations of the filtration elements and fluid pump, may be contemplated which are consistent with the present disclosure.

Figure 5:
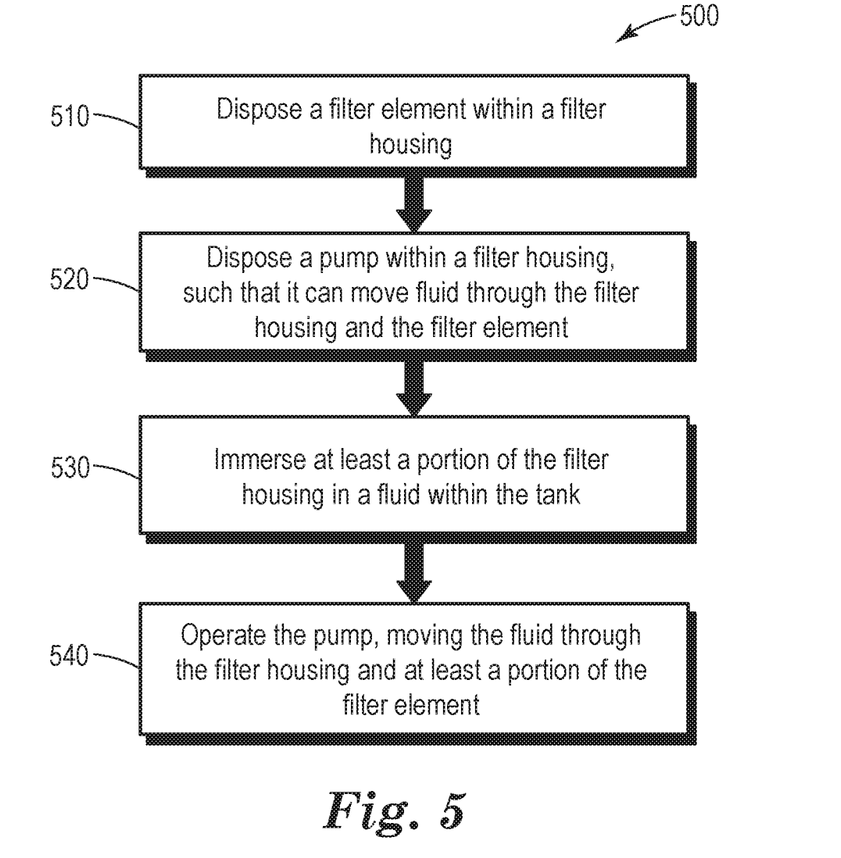
FIG. 5 is a flowchart for a method of filtering a fluid within a tank, in accordance with an embodiment of the present description.

Finally, FIG. 5 is a flowchart for a method of filtering a dielectric fluid within a tank, such as a tank for an immersion cooling system. In step 510, one or more filter elements (e.g., filtration elements 20 of FIG. 1) are disposed with a filter housing. In step 520, a fluid pump is disposed within the filter housing such that it can circulate fluid (i.e., a dielectric cooling fluid) through the filter housing and, in particular, through at least one of the filter elements. In step 530, at least a portion of the filter housing (containing the filter elements and fluid pump) is inserted into a tank at least partially filled with dielectric fluid, such that at least a portion of the filter housing is immersed within the dielectric fluid. In step 540, the pump is operated, such that the dielectric fluid is circulated through the filter housing and the filter elements.

In some embodiments, in an additional step not shown in FIG. 5, the filter elements and fluid pump may be connected by an elongated member (e.g., a connecting rod, fixture, or containing "sleeve"). In some embodiments, another additional step is to provide an opening in the filter housing which is accessible outside the tank, such that the filter elements and/or fluid pump may be removed or accessed for maintenance (e.g., may be removed by grasping and lifting an elongated member connecting the filter elements and fluid pump.)

Terms such as "about" will be understood in the context in which they are used and described in the present description by one of ordinary skill in the art. If the use of "about" as applied to quantities expressing feature sizes, amounts, and physical properties is not otherwise clear to one of ordinary skill in the art in the context in which it is used and described in the present description, "about" will be understood to mean within 10 percent of the specified value. A quantity given as about a specified value can be precisely the specified value. For example, if it is not otherwise clear to one of ordinary skill in the art in the context in which it is used and described in the present description, a quantity having a value of about 1, means that the quantity has a value between 0.9 and 1.1, and that the value could be 1.

Terms such as "substantially" will be understood in the context in which they are used and described in the present description by one of ordinary skill in the art. If the use of "substantially equal" is not otherwise clear to one of ordinary skill in the art in the context in which it is used and described in the present description, "substantially equal" will mean about equal where about is as described above. If the use of "substantially parallel" is not otherwise clear to one of ordinary skill in the art in the context in which it is used and described in the present description, "substantially parallel" will mean within 30 degrees of parallel. Directions or surfaces described as substantially parallel to one another may, in some embodiments, be within 20 degrees, or within 10 degrees of parallel, or may be parallel or nominally parallel. If the use of "substantially aligned" is not otherwise clear to one of ordinary skill in the art in the context in which it is used and described in the present description, "substantially aligned" will mean aligned to within 20% of a width of the objects being aligned. Objects described as substantially aligned may, in some embodiments, be aligned to within 10% or to within 5% of a width of the objects being aligned.

All references, patents, and patent applications referenced in the foregoing are hereby incorporated herein by reference in their entirety in a consistent manner. In the event of inconsistencies or contradictions between portions of the incorporated references and this application, the information in the preceding description shall control.

Descriptions for elements in figures should be understood to apply equally to corresponding elements in other figures, unless indicated otherwise. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A filtration system for a tank, comprising
a filter housing, at least a portion of which is disposed in a tank and in fluidic communication with a dielectric fluid within the tank;
at least one filtration element, disposed within the filter housing, the filter housing comprising an opening disposed on a portion of the filter housing accessible from outside the tank;
a removable elongated member separate from and removably attached to the filter housing; and
a fluid pump, at least a portion of which is disposed within the filter housing and immersed in the dielectric fluid, the fluid pump in fluidic communication with the at least one filtration element;
wherein the fluid pump is unsealed, and an electrical connection of the fluid pump is exposed and at least partially immersed within the dielectric fluid;
wherein the fluid pump and the at least one filtration element are disposed on and physically connected by the removable elongated member such that they may be removed through the opening of the filter housing using the elongated member.

2. The filtration system of claim 1, wherein the elongated member is a central core extending past or through the at least one filtration element and the fluid pump.

3. The filtration system of claim 1, wherein the elongated member is a container at least partially enclosing the at least one filtration element and the fluid pump.

4. The filtration system of claim 1, wherein the tank is an immersion cooling tank for an electronic system.

5. The filtration system of claim 1, further comprising a sensor for determining a status of the at least one filtration element.

6. The filtration system of claim 5, wherein the sensor is a color-changing sensor.

7. The filtration system of claim 5, wherein the sensor is an electronic sensor configured to monitor an electrical property of the at least one filtration element.

* * * * *